United States Patent
Ahn et al.

(10) Patent No.: US 8,054,665 B2
(45) Date of Patent: Nov. 8, 2011

(54) STACKED MEMORY DEVICE INCLUDING A PRE-DECODER/PRE-DRIVER SANDWICHED BETWEEN A PLURALITY OF INTER-DECODERS/INTER-DRIVERS

(75) Inventors: Seung-eon Ahn, Suwon-si (KR);
Ho-jung Kim, Suwon-si (KR);
Chul-woo Park, Yongin-si (KR);
Sang-beom Kang, Hwaseong-si (KR);
Hyun-ho Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 121 days.

(21) Appl. No.: 12/654,645

(22) Filed: Dec. 28, 2009

(65) Prior Publication Data

US 2010/0246234 A1    Sep. 30, 2010

(30) Foreign Application Priority Data

Mar. 25, 2009   (KR) .................. 10-2009-0025541

(51) Int. Cl.
*G11C 5/02* (2006.01)
(52) U.S. Cl. ... 365/51; 365/63; 365/230.06; 365/230.03
(58) Field of Classification Search ............ 365/230.03, 365/230.06, 51, 63, 130
See application file for complete search history.

(56) References Cited

U.S. PATENT DOCUMENTS

| | | | |
|---|---|---|---|
| 4,575,825 A * | 3/1986 | Ozaki et al. .............. 365/193 |
| 6,631,085 B2 | 10/2003 | Kleveland et al. | |
| 6,784,517 B2 | 8/2004 | Kleveland | |
| 6,853,049 B2 | 2/2005 | Herner | |
| 7,020,004 B1 * | 3/2006 | Hurst et al. ................ 365/130 |
| 7,936,627 B2 * | 5/2011 | Fukami ..................... 365/209 |
| 2006/0164882 A1 | 7/2006 | Norman | |
| 2009/0086525 A1 | 4/2009 | Park | |

FOREIGN PATENT DOCUMENTS

| | | |
|---|---|---|
| EP | 2 037 461 A2 | 3/2009 |
| JP | 03-072664 | 3/1991 |
| KR | 10-2008-0075688 | 8/2008 |

OTHER PUBLICATIONS

European Search Report dated Aug. 4, 2010.

* cited by examiner

*Primary Examiner* — Andrew Q Tran
(74) *Attorney, Agent, or Firm* — Harness, Dickey & Pierce, P.L.C.

(57) ABSTRACT

A stacked memory device may include a substrate, a plurality of memory layers stacked on and above the substrate and divided into a plurality of groups, a plurality of inter-decoders electrically connected to and disposed between the plurality of memory layers in a corresponding one of the plurality of groups, and at least one pre-decoder electrically connected to the plurality of inter-decoders and disposed between the plurality of inter-decoders. A stacked memory device may include a substrate, a plurality of memory layers stacked on and above the substrate and divided into a plurality of groups, a plurality of inter-drivers electrically connected to and disposed between the plurality of memory layers in a corresponding one of the plurality of groups, and at least one pre-driver electrically connected to the plurality of inter-drivers, and disposed between the plurality of inter-drivers.

20 Claims, 11 Drawing Sheets

STACKED MEMORY DEVICE INCLUDING A PRE-DECODER/PRE-DRIVER SANDWICHED BETWEEN A PLURALITY OF INTER-DECODERS/INTER-DRIVERS

CROSS-REFERENCE TO RELATED APPLICATION(S)

This application claims priority from Korean Patent Application No. 10-2009-0025541, filed on Mar. 25, 2009, in the Korean Intellectual Property Office (KIPO), the entire contents of which are incorporated herein by reference.

BACKGROUND

1. Field

Example embodiments relate to semiconductor devices. Also, example embodiments relate to stacked memory devices having multi-layer structures.

2. Description of the Related Art

There may be a demand for semiconductor products that are small and, simultaneously, process large amounts of data. Thus, it may be necessary to increase integration of non-volatile memory devices used in semiconductor products. In this regard, there may be consideration for a memory device having a multi-layer structure formed by stacking memory layers in a three-dimensional (3D) manner.

However, there may be limits in increasing the integration since it is not easy to dispose circuits in such a way as to support operation of memory devices having a multi-layer structure.

SUMMARY

Example embodiments may include a stacked memory device that is easily and highly integrated.

Additional aspects may be set forth in part in the description that follows and, in part, may be apparent from the description, or may be learned by practice of example embodiments.

According to example embodiments, a stacked memory device may include a substrate; a plurality of memory layers stacked on and/or above the substrate, and/or divided into a plurality of groups; a plurality of inter-decoders, each electrically connected to the plurality of memory layers in a corresponding one of the plurality of groups, and/or disposed between the plurality of memory layers in a corresponding one of the plurality of groups; and/or at least one pre-decoder electrically connected to the plurality of inter-decoders, and/or disposed between the plurality of inter-decoders.

The stacked memory device may further include a bottom active circuit arranged between the bottommost of the plurality of memory layers and the substrate. The at least one pre-decoder may be electrically connected to the bottom active circuit.

The bottom active circuit may include a row driver. The at least one pre-decoder may receive a signal from the row driver, may pre-decode the signal, and/or may transfer the signal to the plurality of inter-decoders.

The bottom active circuit may include an input-output (I/O) driver. The at least one pre-decoder may receive a signal from the I/O driver, may pre-decode the signal, and/or may transfer the signal to the plurality of inter-decoders.

A plurality of inter-decoders may be separated into a plurality of groups. Each of the plurality of pre-decoders may be connected to the plurality of inter-decoders in a corresponding one of the plurality of groups.

According to example embodiments, a stacked memory device may include a substrate; a plurality of memory layers stacked on and/or above the substrate, and/or divided into a plurality of groups; a plurality of inter-drivers, each electrically connected to the plurality of memory layers in a corresponding one of the plurality of groups, and/or disposed between the plurality of memory layers in a corresponding one of the plurality of groups; and/or at least one pre-driver electrically connected to the plurality of inter-drivers, and/or disposed between the plurality of inter-drivers.

The stacked memory device may further include a bottom active circuit arranged between the bottommost of the plurality of memory layers and the substrate. The at least one pre-driver may be electrically connected to the bottom active circuit.

The bottom active circuit may include a decoder.

According to example embodiments, a stacked memory device may include a substrate, a plurality of memory layers stacked on and/or above the substrate, and/or divided into a plurality of groups, a plurality of inter-decoders, each electrically connected to the plurality of memory layers in a corresponding one of the plurality of groups, and/or disposed between the plurality of memory layers in a corresponding one of the plurality of groups, and/or at least one pre-decoder electrically connected to the plurality of inter-decoders, and/or disposed between the plurality of inter-decoders.

According to example embodiments, a stacked memory device may include a substrate, a plurality of memory layers stacked on and/or above the substrate, and/or divided into a plurality of groups, a plurality of inter-drivers, each electrically connected to the plurality of memory layers in a corresponding one of the plurality of groups, and/or disposed between the plurality of memory layers in a corresponding one of the plurality of groups, and/or at least one pre-driver electrically connected to the plurality of inter-drivers, and/or disposed between the plurality of inter-drivers.

BRIEF DESCRIPTION OF THE DRAWINGS

The above and/or other aspects and advantages will become more apparent and more readily appreciated from the following detailed description of example embodiments, taken in conjunction with the accompanying drawings, in which.

DETAILED DESCRIPTION

Example embodiments will now be described more fully with reference to the accompanying drawings. Embodiments, however, may be embodied in many different forms and should not be construed as being limited to the embodiments set forth herein. Rather, these example embodiments are provided so that this disclosure will be thorough and complete, and will fully convey the scope to those skilled in the art. In the drawings, the thicknesses of layers and regions are exaggerated for clarity.

It will be understood that when an element is referred to as being "on," "connected to," "electrically connected to," or "coupled to" to another component, it may be directly on, connected to, electrically connected to, or coupled to the other component or intervening components may be present. In contrast, when a component is referred to as being "directly on," "directly connected to," "directly electrically connected to," or "directly coupled to" another component, there are no intervening components present. As used herein, the term "and/or" includes any and all combinations of one or more of the associated listed items.

It will be understood that although the terms first, second, third, etc., may be used herein to describe various elements, components, regions, layers, and/or sections, these elements, components, regions, layers, and/or sections should not be limited by these terms. These terms are only used to distinguish one element, component, region, layer, and/or section from another element, component, region, layer, and/or section. For example, a first element, component, region, layer, and/or section could be termed a second element, component, region, layer, and/or section without departing from the teachings of example embodiments.

Spatially relative terms, such as "beneath," "below," "lower," "above," "upper," and the like may be used herein for ease of description to describe the relationship of one component and/or feature to another component and/or feature, or other component(s) and/or feature(s), as illustrated in the drawings. It will be understood that the spatially relative terms are intended to encompass different orientations of the device in use or operation in addition to the orientation depicted in the figures.

The terminology used herein is for the purpose of describing particular example embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, and/or components.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and should not be interpreted in an idealized or overly formal sense unless expressly so defined herein.

Reference will now be made to example embodiments, which are illustrated in the accompanying drawings, wherein like reference numerals may refer to like components throughout.

Figure 1:
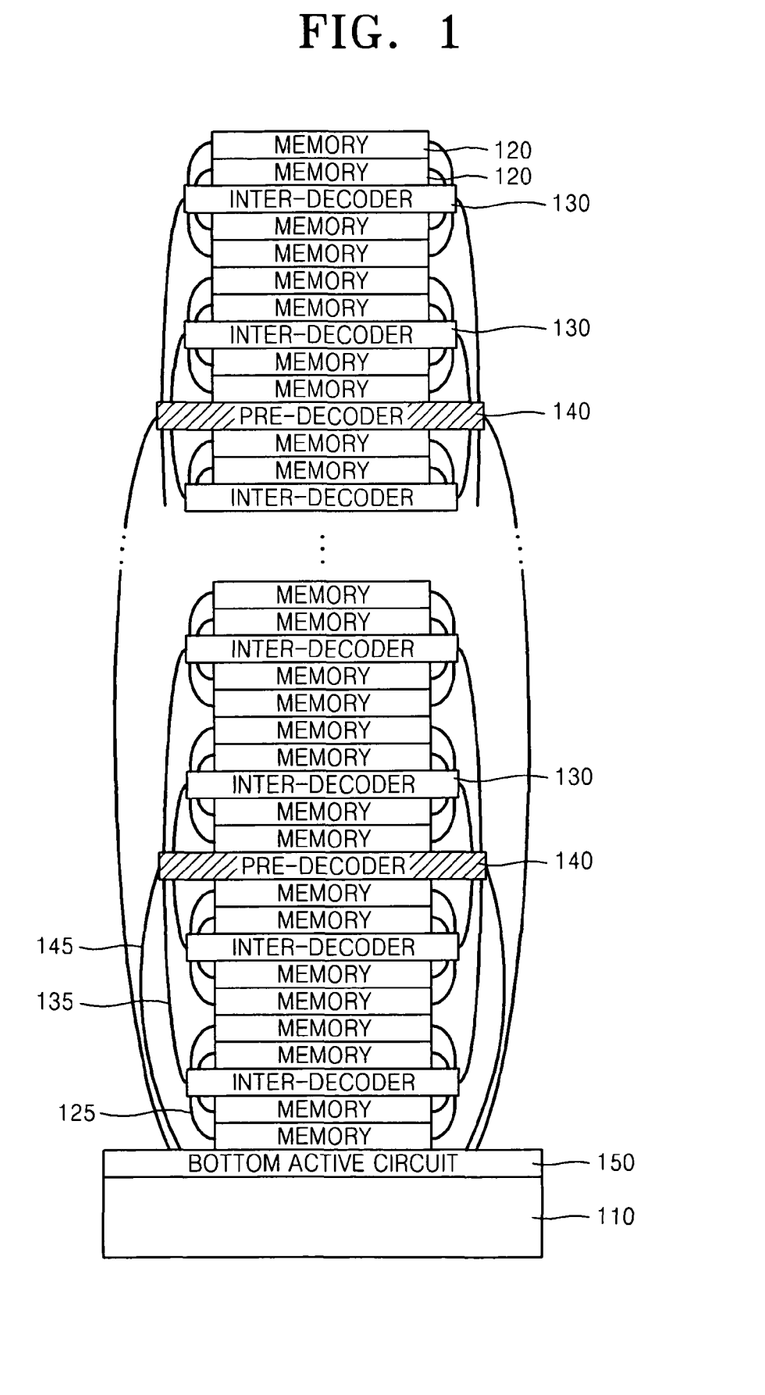
FIGS. 1 through 3 are cross-sectional views of a stacked memory device, according to example embodiments.
Figure 2:
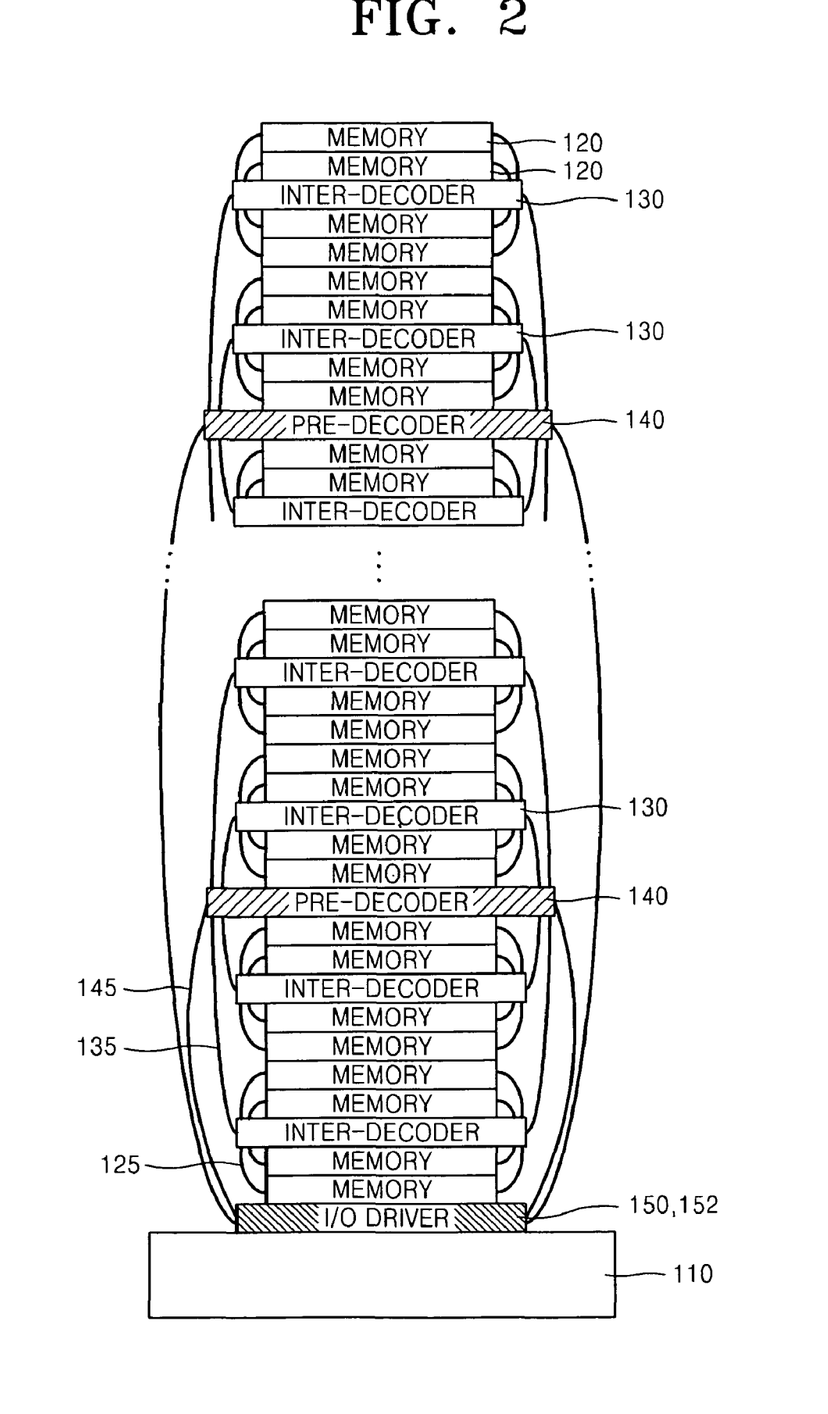
Figure 3:
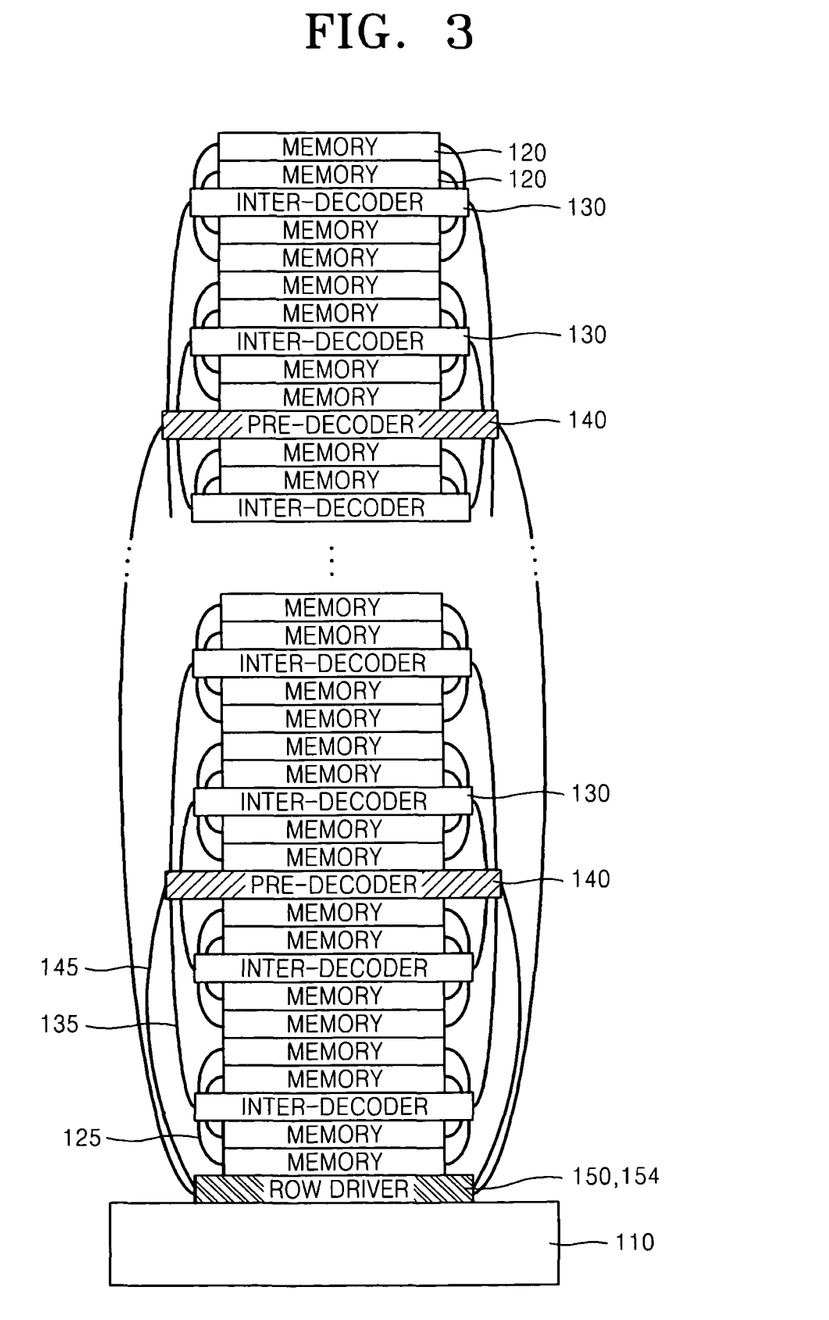

FIGS. 1 through 3 are cross-sectional views of a stacked memory device, according to example embodiments.

Referring to FIG. 1, a plurality of memory layers 120 may be stacked on and/or above a substrate 110. For example, the substrate 110 may include a semiconductor wafer. Each of the memory layers 120 may include an array structure of memory cells (not shown). The number of the memory layers 120 may be appropriately selected according to a memory capacity, and thus is not limited to example embodiments. Each of the memory layers 120 may include one or more of a dynamic random access memory (DRAM), a static random access memory (SRAM), a flash memory, a phase-change random access memory (PRAM), a resistive random access memory (ReRAM), a ferroelectric random access memory (FeRAM), and a magnetoresistive random access memory (MRAM). For example, in the case where each of the memory layers 120 is a ReRAM, each of the memory cells of the memory layers 120 may include a variable resistor and/or a switching device between bit lines and word lines.

The memory layers 120 may be divided into a plurality of groups. Each of a plurality of inter-decoders 130 may be electrically connected to the memory layers 120 in a corresponding group via connecting lines 125. Each of the inter-decoders 130 may be disposed between the memory layers 120 in a corresponding group (e.g., may be disposed at the center of a corresponding group). Thus, the memory layers 120 in a corresponding group may be equally divided and/or adjacently disposed above and/or below the inter-decoder 130 at the center of the corresponding group.

For example, FIG. 1 corresponds to a case in which four of the memory layers 120 may form a group and/or may be electrically connected to one of the inter-decoders 130 in such a manner that two of the four memory layers 120 may be adjacently disposed below the one inter-decoder 130 and/or the other two of the four memory layers 120 may be adjacently disposed above the one inter-decoder 130. However, the number of the memory layers 120 in a group and/or the disposition of the inter-decoder 130 may be appropriately changed, and thus are not limited to the case of FIG. 1.

At least one pre-decoder 140 may be electrically connected to the inter-decoders 130 via connecting lines 135. For example, in the case where the inter-decoders 130 may be separated into a plurality of groups, a plurality of the pre-decoders 140 may be provided. Each of the pre-decoders 140 may be electrically connected to the inter-decoders 130 in a corresponding group. For example, each of the pre-decoders 140 may be disposed between the inter-decoders 130 in a corresponding group (e.g., may be disposed at the center of a corresponding group). Thus, the inter-decoders 130 in a corresponding group may be equally divided and/or adjacently disposed above and/or below the pre-decoder 140 at the center of the corresponding group.

For example, FIG. 1 corresponds to a case in which four of the inter-decoders 130 may form a group and/or may be electrically connected to one of the pre-decoders 140 in such a manner that two of the four inter-decoders 130 may be disposed below the one pre-decoder 140 and/or the other two of the four inter-decoders 130 may be disposed above the one pre-decoder 140. However, the number of the inter-decoders 130 in a group and/or the disposition of the pre-decoder 140 may be appropriately changed, and thus are not limited to the case of FIG. 1.

The pre-decoders 140 may relay a signal transfer between the substrate 110 and the inter-decoders 130. For example, each of the pre-decoders 140 may be electrically connected to a bottom active circuit 150 on the substrate 110 via connecting lines 145. The bottom active circuit 150 may be arranged between the bottommost memory layer 120 and the substrate 110.

Referring to FIG. 2, the bottom active circuit 150 may include an input-output (I/O) driver 152. For example, each of the pre-decoders 140 may pre-decode a signal transferred from the I/O driver 152 and/or may transfer the signal to the inter-decoders 130 in a corresponding group. Each of the inter-decoders 130 may decode and/or transfer the signal to the memory layers 120 in a corresponding group. For example, the signal may include a Y-address signal of memory cells in the memory layers 120.

Referring to FIG. 3, the bottom active circuit 150 may include a row driver 154. For example, each of the pre-decoders 140 may pre-decode a signal transferred from the row driver 154 and/or may transfer the signal to inter-decoders 130 in a corresponding group. Each of the inter-decoders 130 may decode and/or transfer the signal to the memory layers 120 in a corresponding group. For example, the signal may include an X-address signal of memory cells in the memory layers 120.

The bottom active circuit 150 may include the I/O driver 152 and/or the row driver 154. In this case, the Y-address signal of the memory cells may be transferred via the I/O driver 152, and/or the X-address signal of the memory cells may be transferred via the row driver 154. Furthermore, the bottom active circuit 150 may further include other circuits for buffering and/or amplifying the signal.

According to example embodiments, by separately stacking the pre-decoders 140 above the substrate 110, it may be possible to prevent a footprint of the pre-decoders 140 from growing on the substrate 110. If only one pre-decoder is disposed in the bottom active circuit 150, the size of the pre-decoder may increase as the number of memory layers 120 increases. Thus, the area occupied by the pre-decoder may increase such that the number of stackable memory layers 120 is limited, and/or integration of a stacked memory device may decrease. However, according to example embodiments, by stacking the pre-decoders 140 between the memory layers 120, the number of stackable memory layers 120 may not be limited so that integration of the stacked memory device according to example embodiments may be increased.

Figure 4:
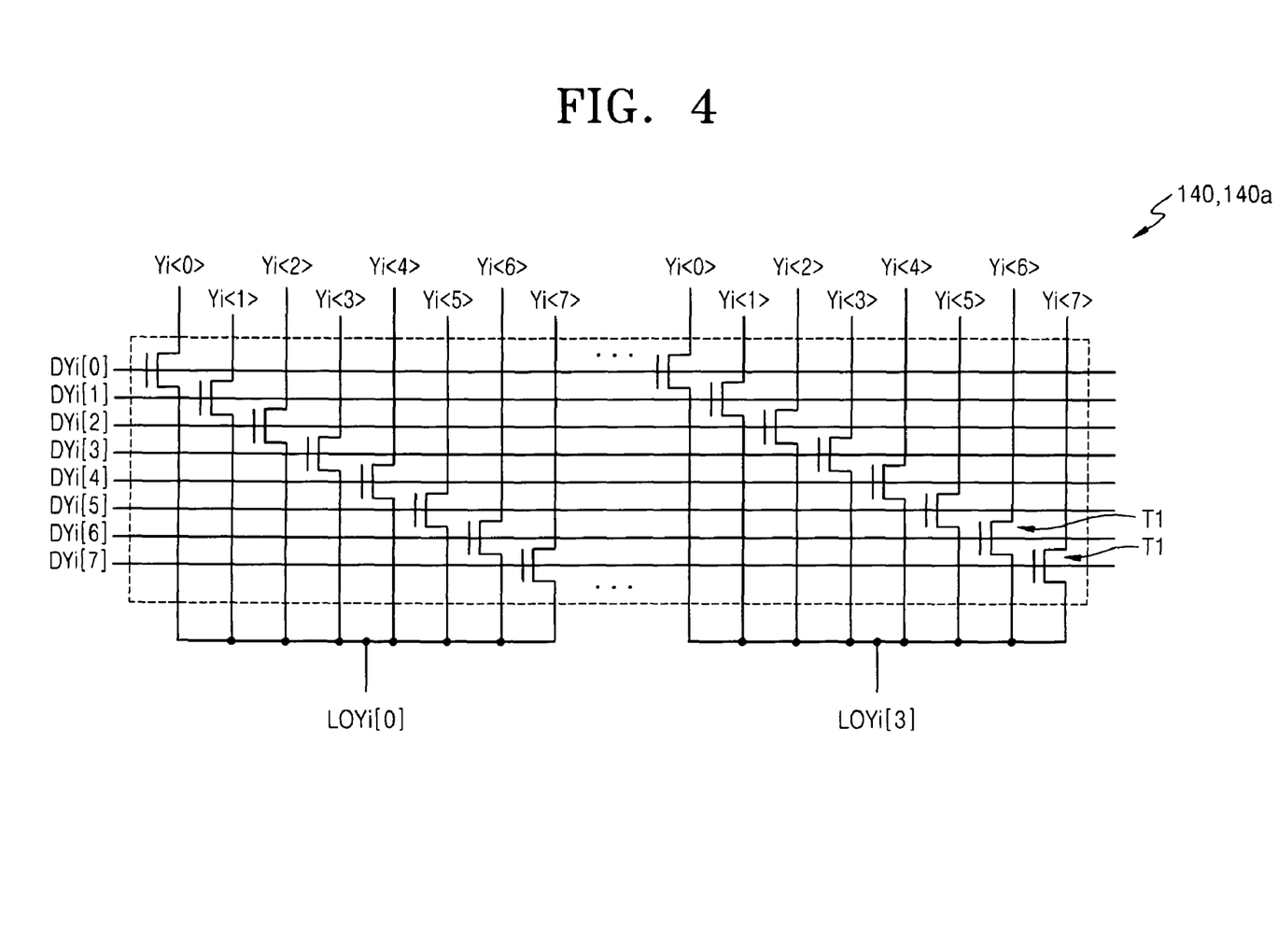
FIGS. 4 and 5 are circuit diagrams for illustrating configuration of a pre-decoder, according to example embodiments.
Figure 5:
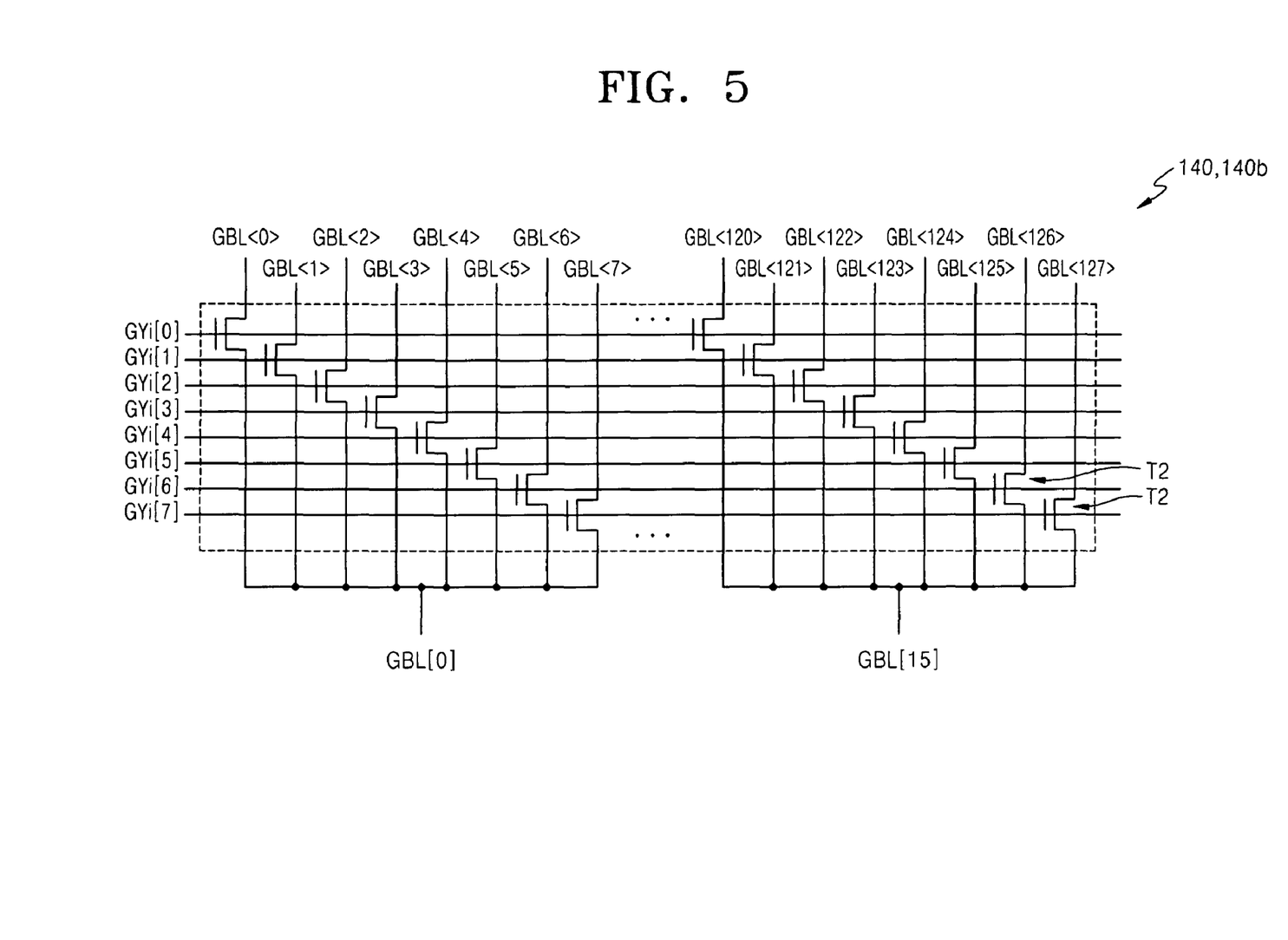

FIGS. 4 and 5 are circuit diagrams for illustrating configuration of the pre-decoder 140, according to example embodiments.

Referring to FIG. 4, each of the pre-decoders 140 may include a control signal decoder 140a. The control signal decoder 140a may include a plurality of transistors T1 that may be the same and/or alternately arrayed. For example, input signals L0Yi[0] through L0Yi[3] may be output as output signals Yi<0> through Yi<7> according to a control of gate signals DYi[0] through DYi[7] that may be connected to gates of the transistors T1.

Referring to FIG. 5, each of the pre-decoders 140 may include a global signal decoder 140b as well as the control signal decoder 140a of FIG. 4. The global signal decoder 140b may include a plurality of transistors T2 that may be the same and/or alternately arrayed. For example, input signals GBL[0] through GBL[15] may be output as output signals GBL<0> through GBL<127> according to a control of gate signals GYi[0] through GYi[7] that may be connected to gates of the transistors T2. The global signal decoder 140b may output a bit line signal and/or a word line signal.

Figure 6:
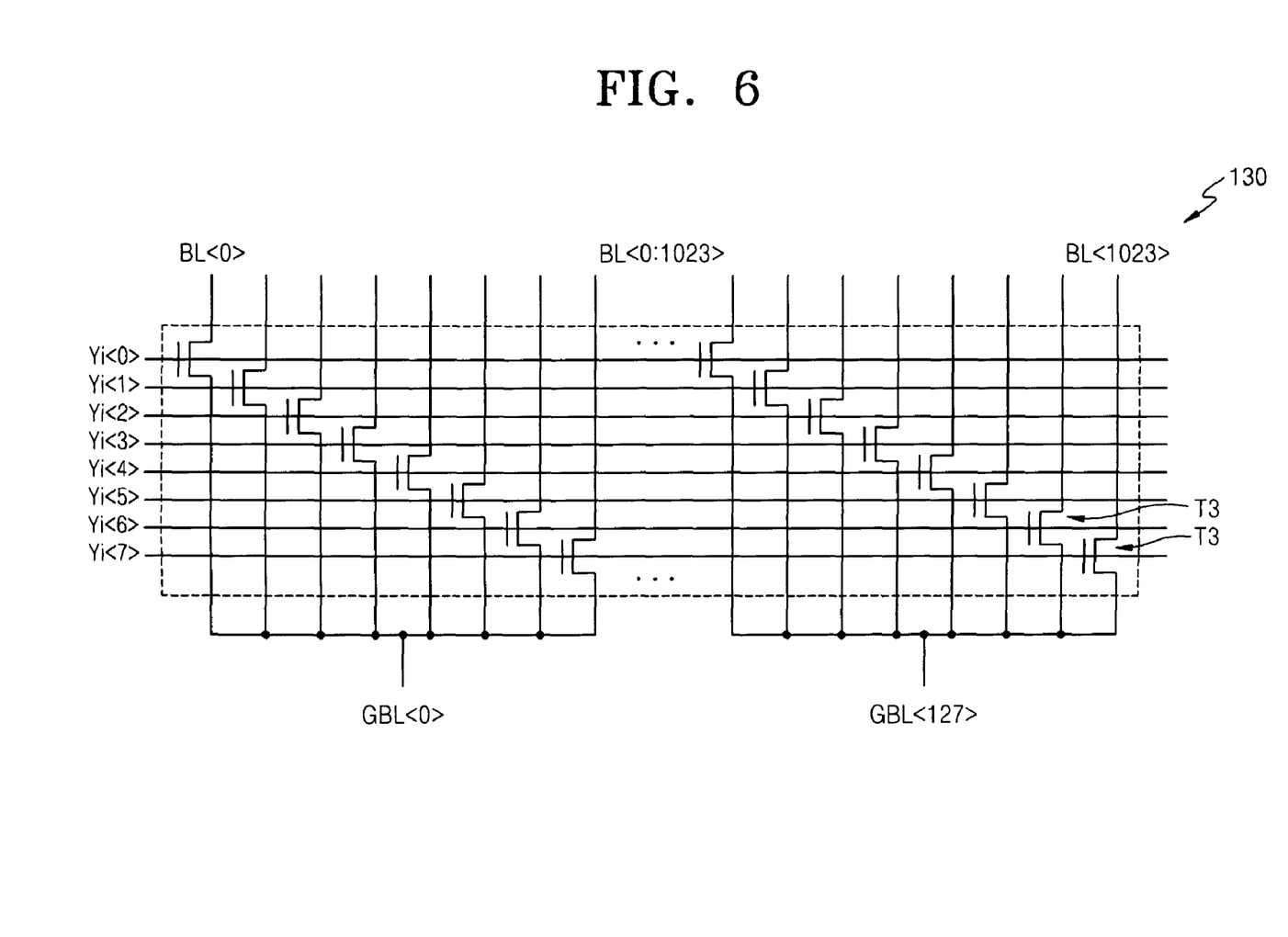
FIG. 6 is a circuit diagram for illustrating configuration of an inter-decoder, according to example embodiments.

FIG. 6 is a circuit diagram for illustrating configuration of the inter-decoder 130, according to example embodiments.

Referring to FIG. 6, the inter-decoder 130 may include a plurality of transistors T3 that may be the same and/or alternately arrayed. For example, input signals GBL<0> through GBL<127> may be output as output signals BL<0> through BL<1023> according to a control of gate signals Yi<0> through Yi<7> that may be connected to gates of the transistors T3. The inter-decoder 130 may output a bit line signal and/or a word line signal.

Figure 7:
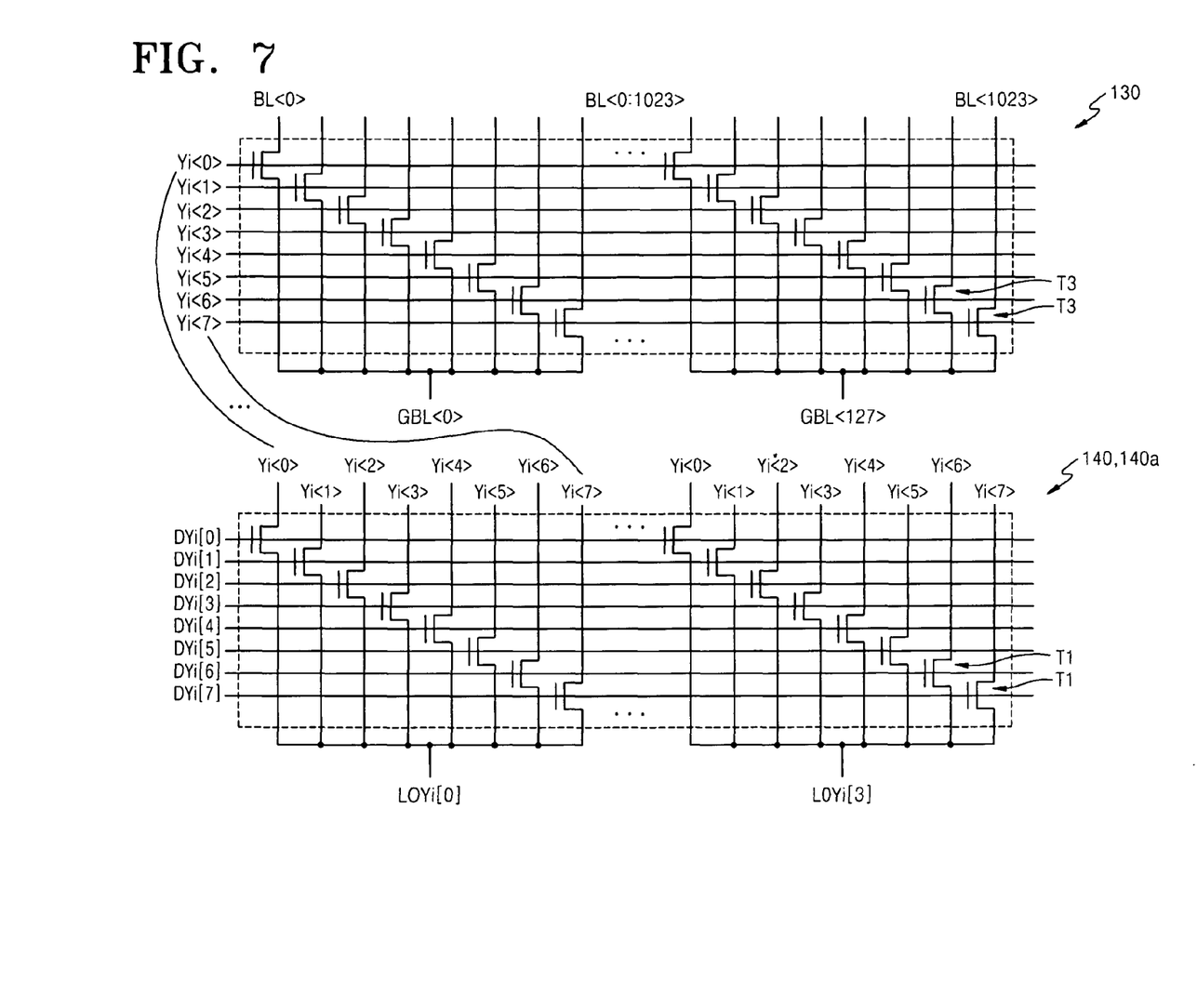
FIGS. 7 and 8 are circuit diagrams for illustrating connection between the pre-decoder and the inter-decoders, according to example embodiments.
Figure 8:
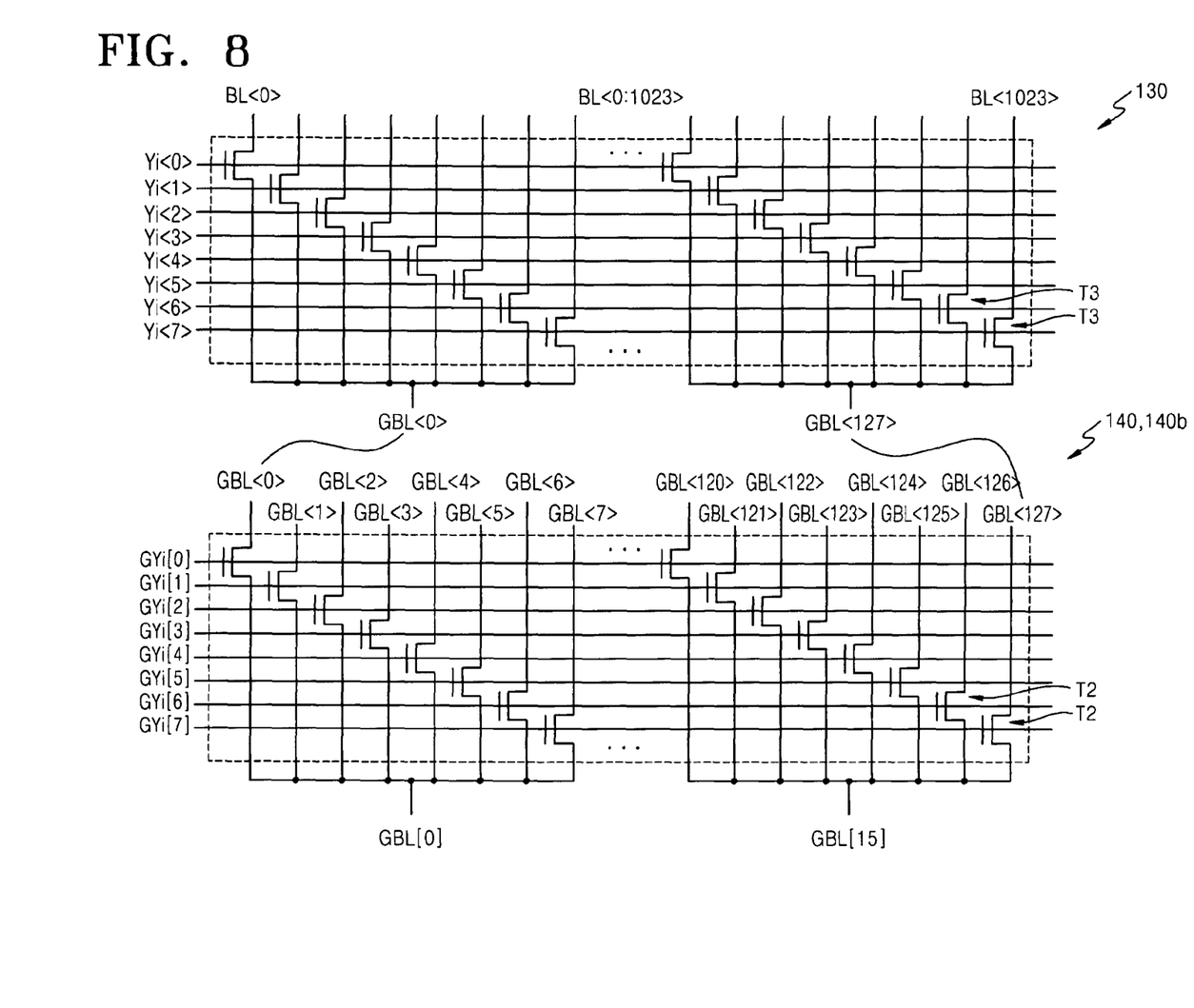

FIGS. 7 and 8 are circuit diagrams for illustrating connection between one of the pre-decoders 140 and four of the inter-decoders 130, according to example embodiments.

Referring to FIGS. 7 and 8, with respect to a memory cell array of 1 MB, the four inter-decoders 130 and/or the one pre-decoder 140 may be connected. As illustrated in FIG. 7, output signals Yi<0> through Yi<7> of a control signal decoder 140a may be electrically connected to gate signals Yi<0> through Yi<7> of the four inter-decoders 130. As illustrated in FIG. 8, output signals GBL<0> through GBL<127> of a global signal decoder 140b may be electrically connected to input signals GBL<0> through GBL<127> of the four inter-decoders 130.

Referring to FIGS. 7 and 8, the number of connecting lines 145 (see FIG. 1) between the pre-decoder 140 and a bottom active circuit 150 (see FIG. 1) may be 108 (=8+4+(24×4)), and the number of connecting lines 135 (see FIG. 1) between the pre-decoder 140 and the four inter-decoders 130 may be 272 (=136×2). If the pre-decoder 140 is not included, the four inter-decoders 130 may be connected to the bottom active circuit 150 (see FIG. 1), and/or the number of connecting lines between the four inter-decoders 130 and the bottom active circuit 150 (see FIG. 1) may be 544 (=136×4), which may be larger than the number of the connecting lines 145 (see FIG. 1). Thus, according to example embodiments, the number of the connecting lines 145 (see FIG. 1) directly connected to the bottom active circuit 150 (see FIG. 1) may be reduced by disposing the pre-decoder 140. Reduction of the number of the connecting lines 145 (see FIG. 1) may correlate to a reduction of size of the bottom active circuit 150 (see FIG. 1).

Figure 9:
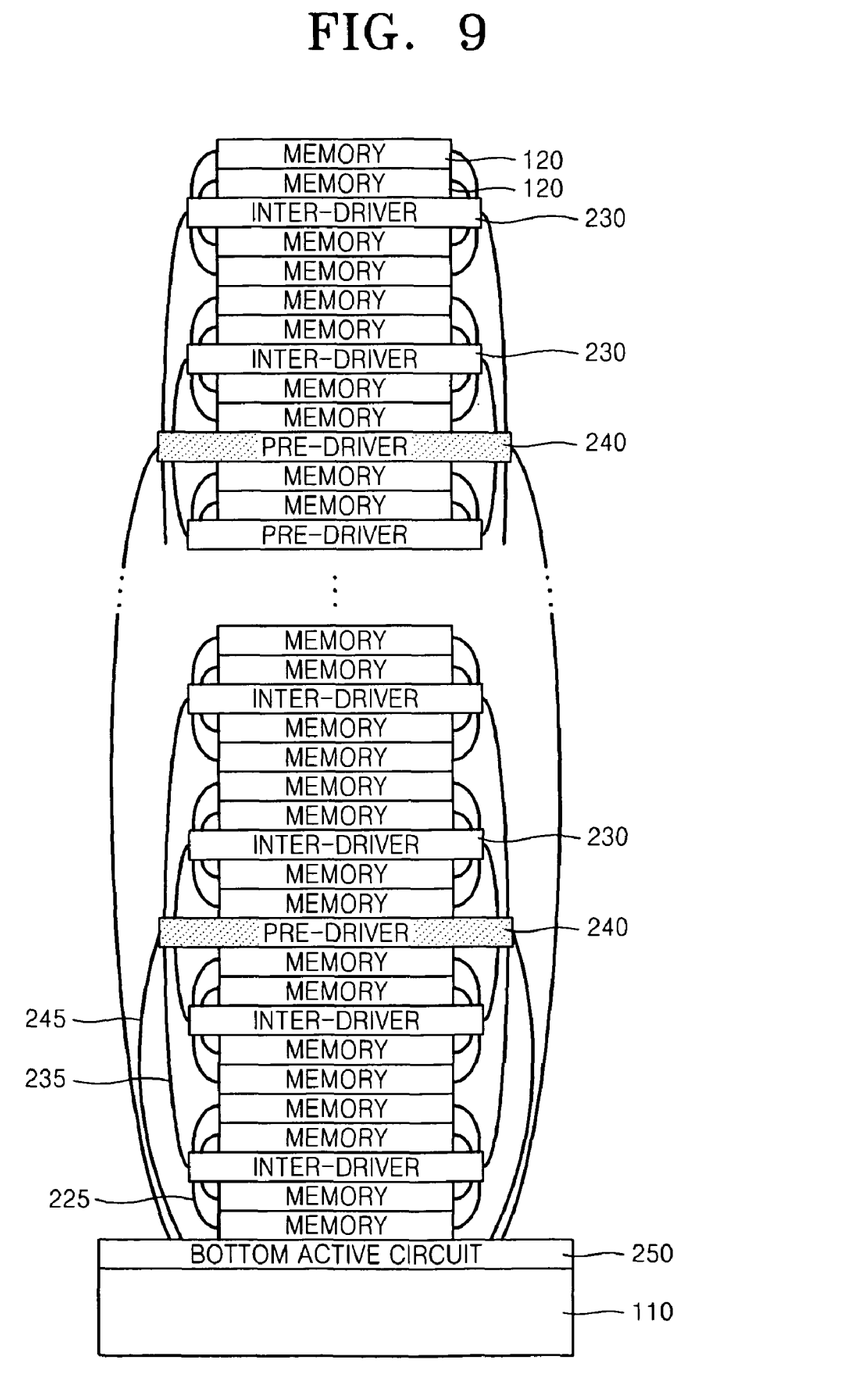
FIGS. 9 and 10 are cross-sectional views of a stacked memory device, according to example embodiments.
Figure 10:
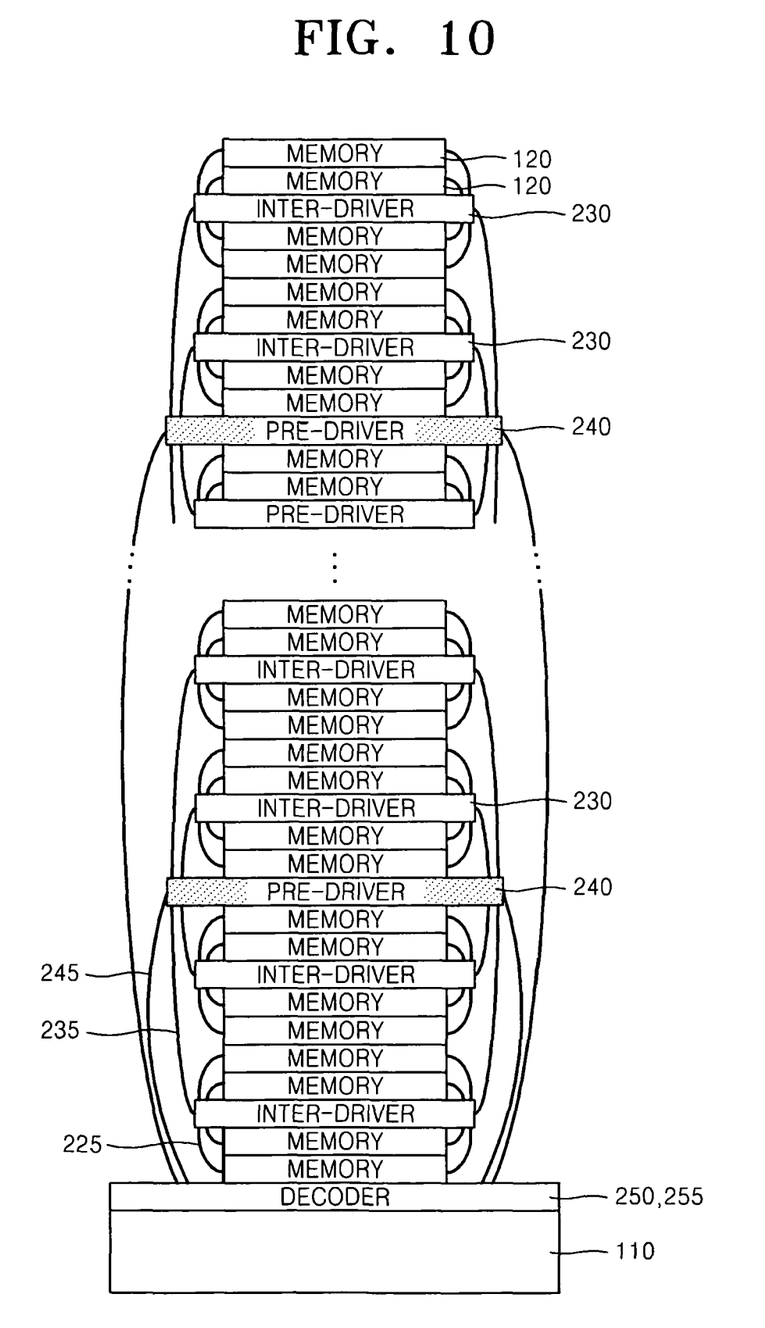

FIGS. 9 and 10 are cross-sectional views of a stacked memory device, according to example embodiments. The stacked memory device according to example embodiments of FIGS. 9 and 10 is modified from the stacked memory device according to example embodiments of FIGS. 1 through 3. Thus, detailed descriptions that are the same as the aforementioned contents will be omitted here.

Referring to FIG. 9, each of a plurality of inter-drivers 230 may be electrically connected to a plurality of the memory layers 120 in a corresponding group via a plurality of connecting lines 225. Each of the inter-drivers 230 may be disposed between the memory layers 120 in a corresponding group (e.g., may be disposed at the center of a corresponding group). Thus, the memory layers 120 in a corresponding group may be equally divided and/or adjacently disposed above and/or below one of the inter-drivers 230 at the center of the corresponding group. However, the number of the memory layers 120 in a group and/or the disposition of the inter-driver 230 are not limited to the case of FIG. 9.

At least one pre-driver 240 may be electrically connected to the inter-drivers 230 via connecting lines 235. For example, in the case where the inter-drivers 230 may be separated into a plurality of groups, a plurality of the pre-drivers 240 may be provided. Each of the pre-drivers 240 may be electrically connected to the inter-drivers 230 in a corresponding group. For example, each of the pre-drivers 240 may be disposed between the inter-drivers 230 in a corresponding group (e.g., may be disposed at the center of a corresponding group). Thus, the inter-drivers 230 in the corresponding group may be equally divided and/or adjacently disposed above and/or below the pre-driver 240 at the center of a corresponding group. However, the number of the inter-drivers 230 in a group and/or the disposition of the pre-driver 240 are not limited to the case of FIG. 9.

The pre-drivers 240 may relay a signal transfer between the substrate 110 and each of the inter-drivers 230. For example, each of the pre-drivers 240 may be electrically connected to a bottom active circuit 250 on the substrate 110 via connecting lines 245. The bottom active circuit 250 may be arranged between the bottommost of the memory layers 120 and the substrate 110.

Referring to FIG. 10, the bottom active circuit 250 may include a decoder 255. Thus, the pre-drivers 240 may be connected to the decoder 255 via connecting lines 245. A signal decoded by the decoder 255 may be preliminarily driven by the pre-drivers 240 and/or then may be mainly driven by the inter-drivers 230 so as to be transferred to the memory layers 120. The bottom active circuit 250 may further include circuits for buffering and/or amplifying the signal.

Figure 11:
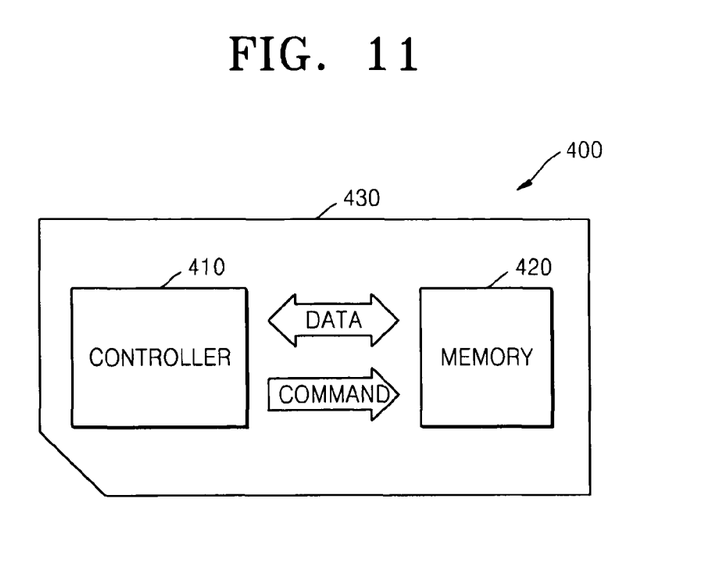
FIG. 11 is a schematic diagram of a memory card, according to example embodiments.

FIG. 11 is a schematic diagram of a memory card 400, according to example embodiments.

Referring to FIG. 11, a housing 430 for the memory card 400 may include a controller 410 and/or a memory unit 420. The controller 410 and the memory unit 420 may exchange an electrical signal. For example, the controller 410 and the memory unit 420 may exchange data according to a command from the controller 410. Thus, the memory card 400 may store data in the memory unit 420 and/or may externally output data from the memory unit 420.

The memory unit 420 may include the stacked memory device according to example embodiments of FIGS. 1 through 10. The memory card 400 may be used as a data storage medium for various portable devices. For example, the memory card 400 may include a multimedia card (MMC) and/or a secure digital card (SD card).

Figure 12:
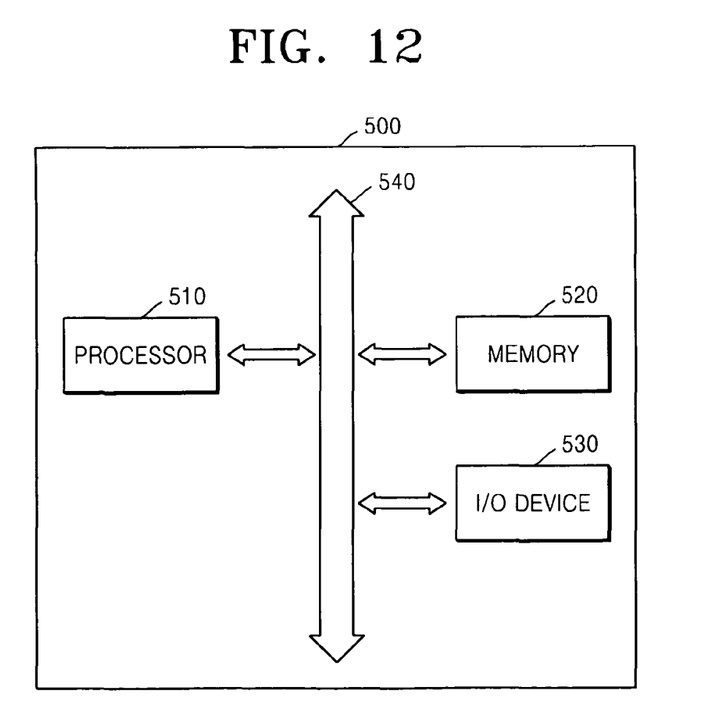
FIG. 12 is a block diagram of an electronic system, according to example embodiments.

FIG. 12 is a block diagram of an electronic system 500, according to example embodiments.

Referring to FIG. 12, the electronic system 500 may include a processor 510, an I/O device 530, and/or a memory unit 520 that may perform data communication with each other using a bus 540. The processor 510 may function to execute a program and/or to control the electronic system 500. The I/O device 530 may be used to input data to and/or output data from the electronic system 500. The electronic system 500 may be connected to an external device such as a personal computer (PC) and/or a network by using the I/O device 530, and/or may exchange data with the external device. The memory unit 520 may store codes and/or data for operating the processor 510. For example, the memory unit 520 may include the stacked memory device according to example embodiments of FIGS. 1 through 10.

The electronic system 500 may configure various electronic control devices that may use the memory unit 520. For example, the electronic system 500 may be used in mobile phones, MPEG-1 Audio Layer 3 (MP3 players), navigations, solid state disks (SSDs), household appliances, or the like.

While example embodiments have been particularly shown and described, it will be understood by those of ordinary skill in the art that various changes in form and details may be made therein without departing from the spirit and scope of the present invention as defined by the following claims.

What is claimed is:

1. A stacked memory device, comprising:
   a substrate;
   a plurality of memory layers stacked on and above the substrate, and divided into a plurality of groups;
   a plurality of inter-decoders, each electrically connected to the plurality of memory layers in the corresponding one of the plurality of groups, and disposed between the plurality of memory layers in a corresponding one of the plurality of groups; and
   at least one pre-decoder electrically connected to the plurality of inter-decoders, and disposed between the plurality of inter-decoders.

2. The stacked memory device of claim 1, further comprising:
   a bottom active circuit arranged between a bottommost of the plurality of memory layers and the substrate;
   wherein the at least one pre-decoder is electrically connected to the bottom active circuit.

3. The stacked memory device of claim 2, wherein a number of vertical connecting lines between the at least one pre-decoder and the bottom active circuit is less than a number of vertical connecting lines between the plurality of inter-decoders and the bottom active circuit for a case in which the plurality of inter-decoders are connected to the bottom active circuit without the at least one pre-decoder.

4. The stacked memory device of claim 2, wherein the bottom active circuit comprises a row driver, and
   wherein the at least one pre-decoder receives a signal from the row driver, pre-decodes the signal, and then transfers the signal to the plurality of inter-decoders.

5. The stacked memory device of claim 2, wherein the bottom active circuit comprises an input-output (I/O) driver, and
   wherein the at least one pre-decoder receives a signal from the I/O driver, pre-decodes the signal, and then transfers the signal to the plurality of inter-decoders.

6. The stacked memory device of claim 1, wherein the plurality of inter-decoders are separated into a plurality of groups, and
   wherein the at least one pre-decoder is connected to the plurality of inter-decoders in a corresponding one of the plurality of groups.

7. The stacked memory device of claim 6, further comprising:
   a bottom active circuit arranged between a bottommost of the plurality of memory layers and the substrate;
   wherein the at least one pre-decoder is electrically connected to the bottom active circuit.

8. The stacked memory device of claim 6, wherein the at least one pre-decoder is disposed at a center between the plurality of inter-decoders in a corresponding one of the plurality of groups.

9. The stacked memory device of claim 1, wherein each of the plurality of inter-decoders is disposed at a center between the plurality of memory layers in the corresponding one of the plurality of groups.

10. The stacked memory device of claim 1, wherein the at least one pre-decoder comprises a control signal decoder.

11. The stacked memory device of claim 1, wherein the at least one pre-decoder comprises a global signal decoder.

12. The stacked memory device of claim 1, wherein the at least one pre-decoder comprises a control signal decoder and a global signal decoder.

13. The stacked memory device of claim 1, wherein the at least one pre-decoder comprises a plurality of transistors of a same type.

14. The stacked memory device of claim 1, wherein at least one of the plurality of inter-decoders comprises a plurality of transistors of a same type.

15. The stacked memory device of claim 1, wherein each of the plurality of inter-decoders comprises a plurality of transistors of a same type.

16. A stacked memory device, comprising:
   a substrate;
   a plurality of memory layers stacked on and above the substrate, and divided into a plurality of groups;

a plurality of inter-drivers, each electrically connected to the plurality of memory layers in a corresponding one of the plurality of groups, and disposed between the plurality of memory layers in the corresponding one of the plurality of groups; and at least one pre-driver electrically connected to the plurality of inter-drivers, and disposed between the plurality of inter-drivers.

17. The stacked memory device of claim 16, further comprising:

a bottom active circuit arranged between a bottommost of the plurality of memory layers and the substrate;

wherein the at least one pre-driver is electrically connected to the bottom active circuit.

18. The stacked memory device of claim 17, wherein the bottom active circuit comprises a decoder.

19. The stacked memory device of claim 16, wherein the at least one pre-driver is disposed at the center between the plurality of inter-drivers in a corresponding one of the plurality of groups.

20. The stacked memory device of claim 16, wherein each of the plurality of inter-drivers is disposed at a center between the plurality of memory layers in the corresponding one of the plurality of groups.

* * * * *